US012765140B2

(12) United States Patent
Nakagami

(10) Patent No.: US 12,765,140 B2
(45) Date of Patent: Oct. 13, 2026

(54) LIGHT-EMITTING DEVICE AND METHOD FOR MANUFACTURING LIGHT-EMITTING DEVICE

(71) Applicant: NICHIA CORPORATION, Anan (JP)

(72) Inventor: Ryuichi Nakagami, Anan (JP)

(73) Assignee: NICHIA CORPORATION, Anen (JP)

( * ) Notice: Subject to any disclaimer, the term of this patent is extended or adjusted under 35 U.S.C. 154(b) by 566 days.

(21) Appl. No.: 18/167,069

(22) Filed: Feb. 10, 2023

(65) Prior Publication Data

US 2023/0268473 A1 Aug. 24, 2023

(30) Foreign Application Priority Data

Feb. 24, 2022 (JP) ................................ 2022-026619

(51) Int. Cl.

| | |
|---|---|
| ***H10H 20/856*** | (2025.01) |
| ***H10H 20/01*** | (2025.01) |
| ***H10H 20/831*** | (2025.01) |
| ***H10H 20/857*** | (2025.01) |

(52) U.S. Cl.

CPC .......... *H10H 20/856* (2025.01); *H10H 20/01* (2025.01); *H10H 20/8312* (2025.01); *H10H 20/857* (2025.01); *H10H 20/032* (2025.01); *H10H 20/0363* (2025.01); *H10H 20/0364* (2025.01)

(58) Field of Classification Search

CPC ............. H10H 20/586; H10H 20/8312; H10H 20/857; H10H 20/032

See application file for complete search history.

(56) References Cited

U.S. PATENT DOCUMENTS

| | | | | |
|---|---|---|---|---|
| 10,586,899 B2 * | 3/2020 | Tokunaga | .............. | H10D 89/60 |
| 10,707,383 B2 * | 7/2020 | Sogai | ...................... | H10H 20/01 |
| 2005/0231551 A1 * | 10/2005 | Gibson | .................. | B41J 2/1623 347/45 |
| 2011/0175117 A1 | 7/2011 | Jagt et al. | | |

(Continued)

FOREIGN PATENT DOCUMENTS

| | | |
|---|---|---|
| JP | 2010-219324 | 9/2010 |
| JP | 2010219324 A * | 9/2010 |

(Continued)

*Primary Examiner* — Monica D Harrison
*Assistant Examiner* — Jacob T Nelson
(74) *Attorney, Agent, or Firm* — MORI & WARD, LLP

(57) ABSTRACT

A light-emitting device including a light-emitting element having a first surface serving as a light extracting surface, a second surface, and a lateral surface, where an element electrode is provided on the second surface. Aa light-transmissive member is disposed on the first surface, and an adhesive resin is provided forming an adhesive layer between the first surface and the light-transmissive member, and forming a fillet on the lateral surface. The device includes a substrate including wiring, a conductive member connected to the element electrode and the wiring, and an underfill disposed between the second surface and an upper surface of the substrate and disposed on the upper surface at a position proximate to a peripheral edge of the light-emitting element in contact with the lateral surface or the fillet. The underfill disposed between the second surface and the upper surface is separated from the second surface with a clearance.

21 Claims, 6 Drawing Sheets

(56) References Cited

U.S. PATENT DOCUMENTS

| | | | |
|---|---|---|---|
| 2012/0236582 | A1 | 9/2012 | Waragaya et al. |
| 2015/0346387 | A1* | 12/2015 | Yamasaki .......... C07D 295/185 528/85 |
| 2017/0101556 | A1* | 4/2017 | Keite-Telgenbüscher .................. C08L 63/00 |
| 2017/0154880 | A1 | 6/2017 | Ozeki et al. |
| 2018/0097150 | A1 | 4/2018 | Ikeda et al. |
| 2018/0212106 | A1 | 7/2018 | Chien et al. |
| 2018/0309035 | A1 | 10/2018 | Bando et al. |
| 2019/0165224 | A1 | 5/2019 | Tokunaga |
| 2019/0385993 | A1 | 12/2019 | Ozeki et al. |
| 2021/0020621 | A1 | 1/2021 | Ozeki et al. |
| 2021/0054201 | A1* | 2/2021 | Lu ........................... C08L 83/14 |
| 2022/0005992 | A1 | 1/2022 | Fujioka et al. |
| 2022/0302098 | A1 | 9/2022 | Ozeki et al. |

FOREIGN PATENT DOCUMENTS

| | | | | |
|---|---|---|---|---|
| JP | 2011-134829 | | 7/2011 | |
| JP | 2011134829 A | * | 7/2011 | |
| JP | 2012-004303 | | 1/2012 | |
| JP | 2012-503876 | | 2/2012 | |
| JP | 2013-021119 | | 1/2013 | |
| JP | 2014-029894 | | 2/2014 | |
| JP | 2015-012203 | | 1/2015 | |
| JP | 2015-053436 | | 3/2015 | |
| JP | 2017-069539 | | 4/2017 | |
| JP | 6114610 B2 | * | 4/2017 | |
| JP | 2017-108092 | | 6/2017 | |
| JP | 2017108092 A | * | 6/2017 | ......... H01L 25/0753 |
| JP | 2017-188698 | | 10/2017 | |
| JP | 2018-186264 | | 11/2018 | |
| JP | 2019-096842 | | 6/2019 | |
| JP | 2022-014288 | | 1/2022 | |

* cited by examiner

LIGHT-EMITTING DEVICE AND METHOD FOR MANUFACTURING LIGHT-EMITTING DEVICE

CROSS-REFERENCE TO RELATED APPLICATIONS

The present application claims priority under 35 U.S.C. § 119 to Japanese Patent Application No. 2022-026619, filed Feb. 24, 2022, the contents of which is hereby incorporated by reference in its entirety.

BACKGROUND

1. Technical Field

The present disclosure relates to a light-emitting device and a method for manufacturing the light-emitting device.

2. Description of Related Art

A semiconductor device has been known in which a semiconductor element is face-down mounted on a substrate via solder bumps (see, for example, Japanese Unexamined Patent Application Publication No. 2013-21119). Japanese Unexamined Patent Application Publication No. 2013-21119 describes that the solder bumps can be aligned easily and a semiconductor device including underfill without void can be provided, by using a resin material set in advance between a lower surface of the semiconductor element and an upper surface of the substrate.

SUMMARY

The present disclosure can provide a light-emitting device and a method for manufacturing the light-emitting device that allows stress under thermal expansion of underfill to be relaxed.

A light-emitting device disclosed in an embodiment includes a light-emitting element including a first surface serving as a light extracting surface, a second surface opposite to the first surface, and a lateral surface connecting the first surface and the second surface, and including an element electrode provided on the second surface, a light-transmissive member that is disposed on the first surface of the light-emitting element and allows light from the light-emitting element to pass through, an adhesive resin forming an adhesive layer between the first surface of the light-emitting element and the light-transmissive member, and forming a fillet on at least a part of the lateral surface of the light-emitting element, a substrate including wiring electrically connecting to the element electrode, a conductive member connected to the element electrode of the light-emitting element and the wiring of the substrate, and an underfill disposed between the second surface of the light-emitting element and an upper surface of the substrate, and disposed on the upper surface of the substrate at a position proximate to a peripheral edge of the light-emitting element. The underfill that is disposed between the second surface of the light-emitting element and the upper surface of the substrate is separated from the second surface of the light-emitting element with a clearance, and the underfill that is disposed on the upper surface of the substrate at the position proximate to the peripheral edge of the light-emitting element is in contact with the lateral surface of the light-emitting element or the fillet.

A method for manufacturing a light-emitting device disclosed in an embodiment includes providing a light-emitting element disposed substrate where an element electrode and a substrate are electrically joined through a conductive member by providing a light-emitting element including a first surface serving as a light extracting surface, a second surface opposite to the first surface, and a lateral surface connecting the first surface and the second surface, and including the element electrode disposed on the second surface, and by providing the substrate, disposing a light-transmissive member including a lateral surface positioned outward from the lateral surface of the light-emitting element by disposing an adhesive resin on the first surface of the light-emitting element, disposing an underfill on the substrate at a position proximate to a peripheral edge of the light-emitting element and on the substrate at a position facing the second surface of the light-emitting element, drying the substrate where the underfill is disposed at a temperature of 70° C. or lower, and disposing a light-reflective member directly or indirectly covering the substrate and the light-emitting element. The step of disposing the light-transmissive member includes disposing the adhesive resin between the first surface of the light-emitting element and the light-transmissive member, and disposing the adhesive resin on at least a part of the lateral surface of the light-emitting element, and the underfill is disposed in a state where the underfill is in contact with the lateral surface of the light-emitting element or the adhesive resin disposed on the lateral surface of the light-emitting element and is disposed on the substrate in a state where the underfill is separated from the second surface of the light-emitting element with a clearance by the step of drying.

With the present disclosure, a light-emitting device and a method for manufacturing the light-emitting device can be provided that allow stress under thermal expansion of an underfill to be relaxed.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENT

Embodiments

Figure 1:
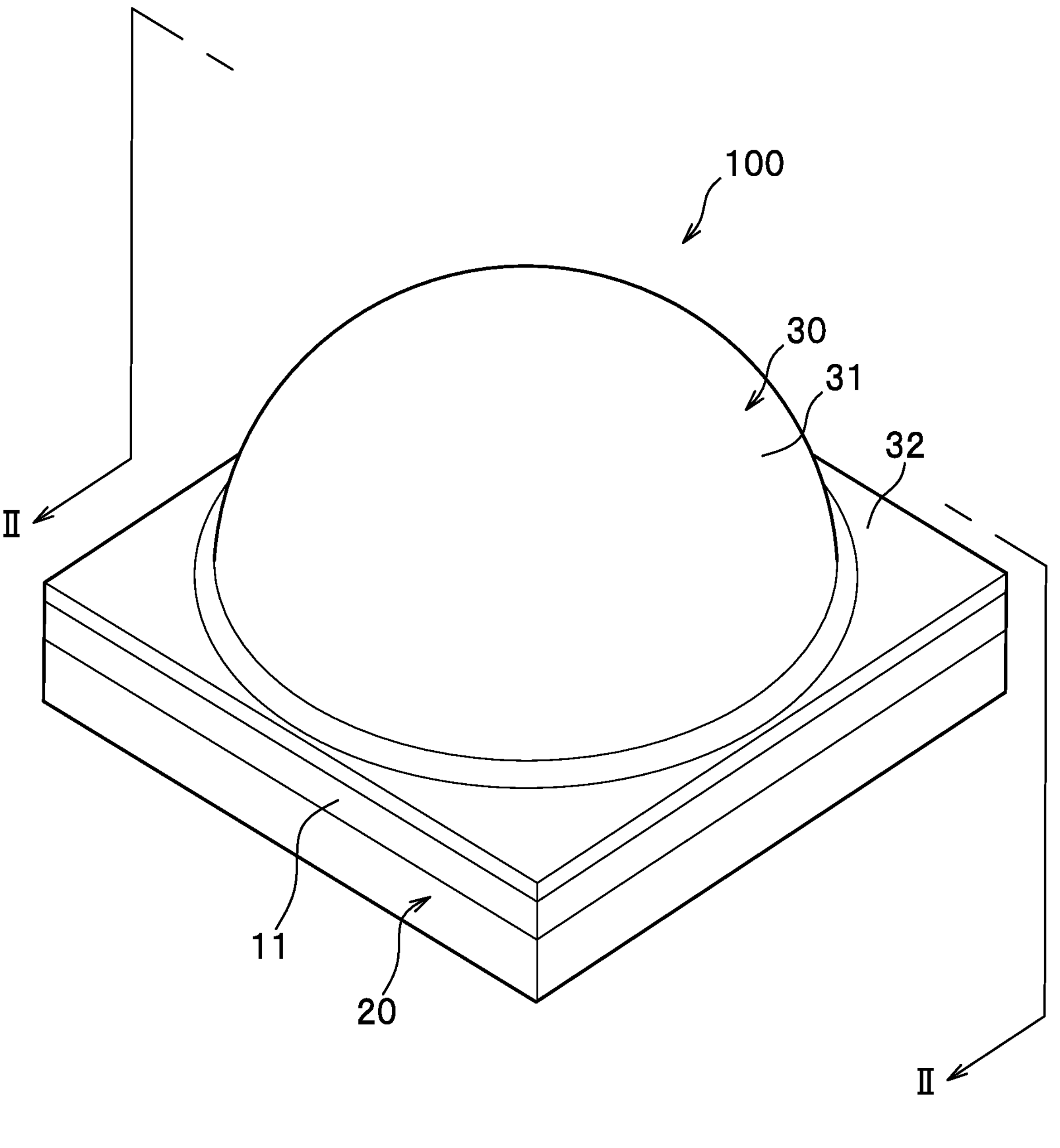
FIG. 1 is a perspective view schematically illustrating an entire light-emitting device according to a first embodiment.

Embodiments will be described below with reference to the drawings. However, modes given herein below are provided for illustrating the light-emitting device and the method for manufacturing the light-emitting device that embody the technical ideas of the present disclosure, and thus does not limit the present disclosure. Further, dimensions, materials, shapes, relative arrangements, or the like of components described in the embodiments are not intended to limit the scope of the present invention thereto, unless otherwise specified, and are merely exemplary. Note that, size, positional relationship, and the like of members illustrated in the drawings can be exaggerated or simplified for clarity of description. In the embodiments, "covering" is not limited to a case of direct contact, but also includes a case of indirectly covering, for example, via another member.

Light-Emitting Device

Figure 2:
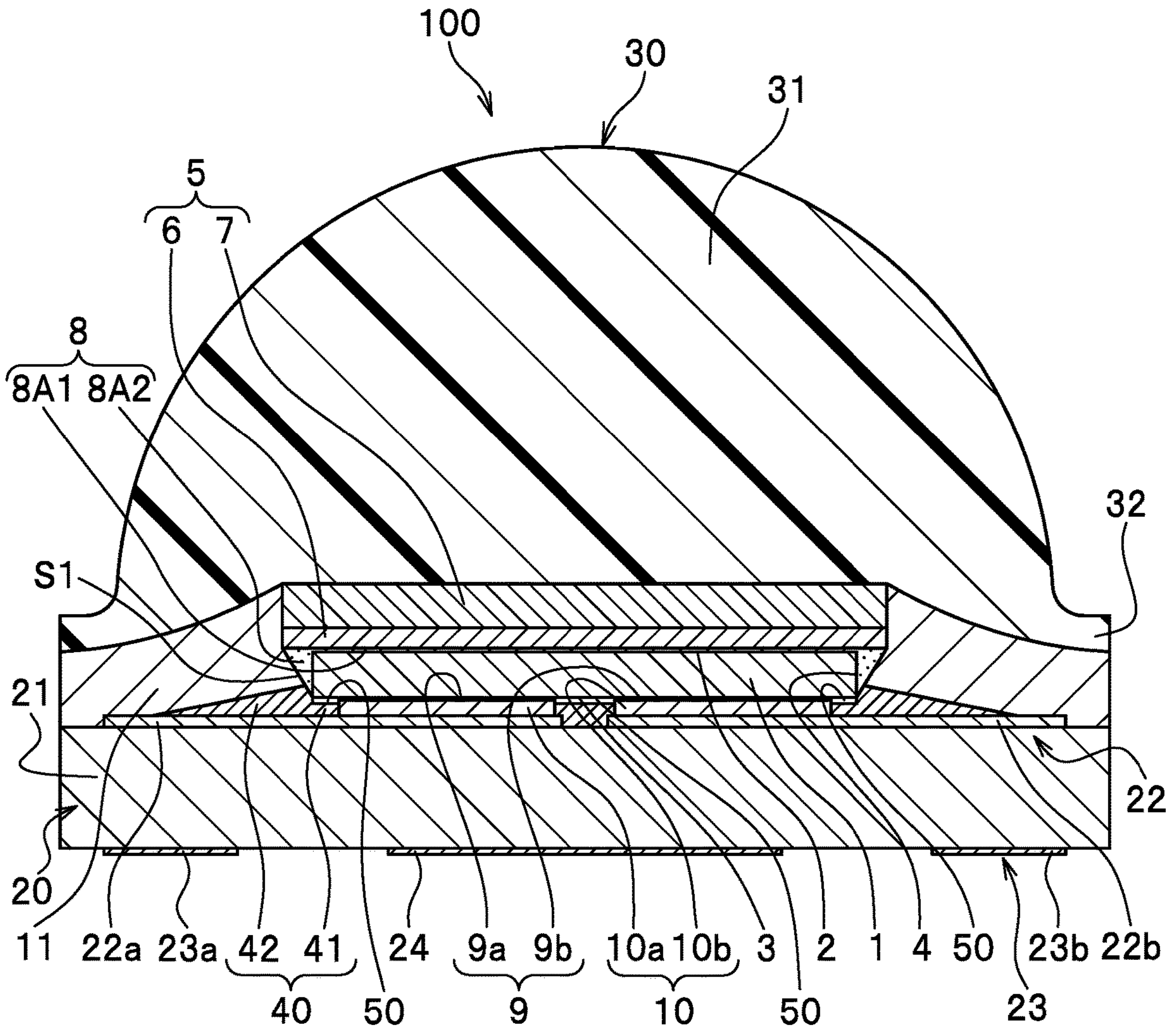
FIG. 2 is a cross-sectional view taken along line II-II in FIG. 1.
Figure 3:
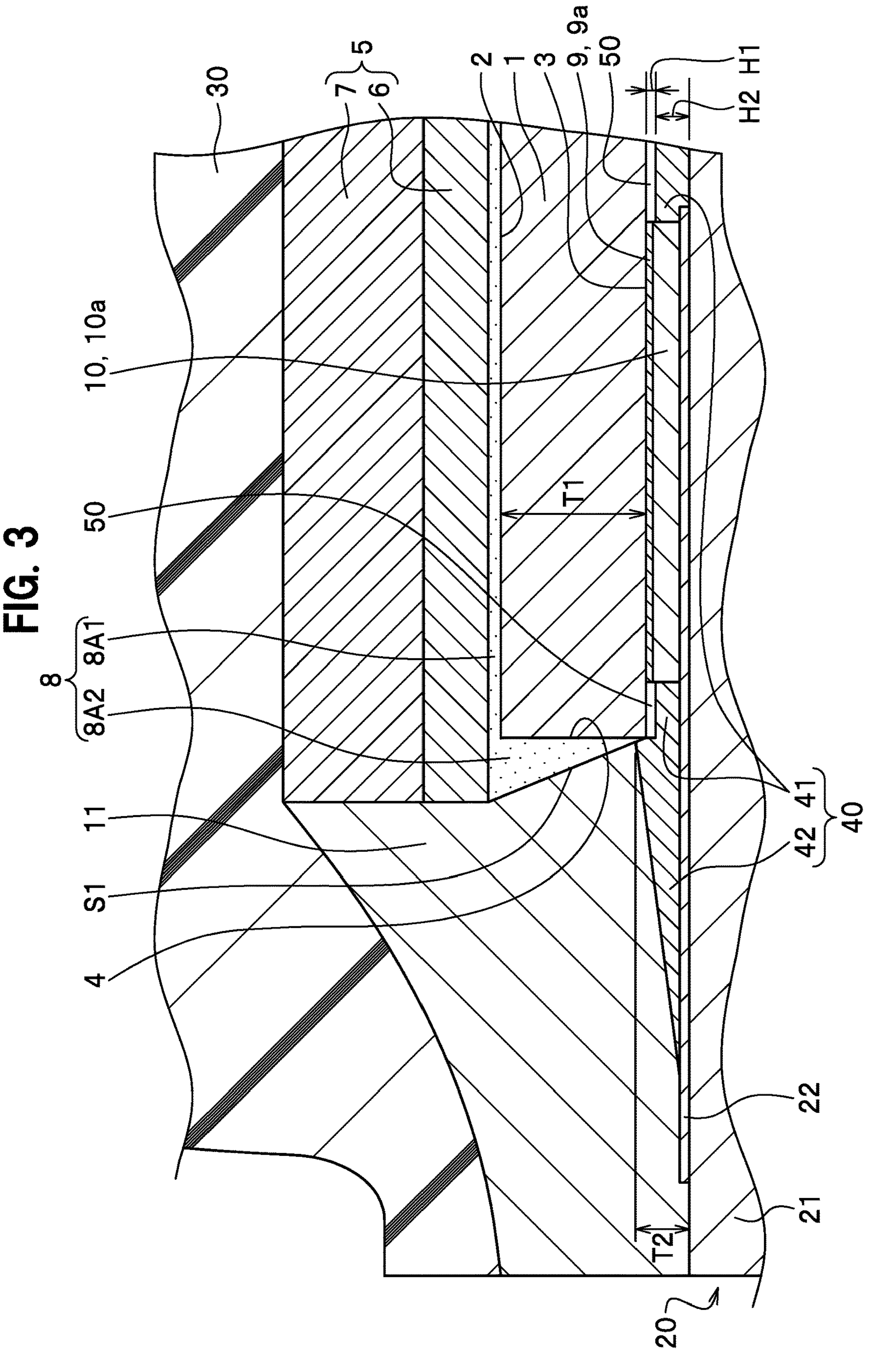
FIG. 3 is an enlarged cross-sectional view of a part of FIG. 2.

A light-emitting device 100 according to an embodiment will be described with reference to FIGS. 1 to 3. FIG. 1 is a perspective view schematically illustrating the entire light-emitting device according to a first embodiment. FIG. 2 is a cross-sectional view taken along line II-II in FIG. 1. FIG. 3 is an enlarged cross-sectional view of a part of FIG. 2

The light-emitting device 100 includes a light-emitting element 1 including a first surface 2 serving as a light extracting surface, a second surface 3 opposite to the first surface 2, and a lateral surface 4 connecting the first surface 2 and the second surface 3, and including an element electrode 9 provided on the second surface 3, a light-transmissive member 5 that is disposed on the first surface 2 of the light-emitting element 1 and allows light from the light-emitting element 1 to pass through, an adhesive resin 8 forming an adhesive layer 8A1 between the first surface 2 of the light-emitting element 1 and the light-transmissive member 5, and forming a fillet 8A2 on at least a part of the lateral surface 4 of the light-emitting element 1, a substrate 20 including wiring 22 electrically connecting to the element electrode 9, a conductive member 10 connected to the element electrode 9 of the light-emitting element 1 and the wiring 22 of the substrate 20, and an underfill 40 disposed between the second surface 3 of the light-emitting element 1 and an upper surface of the substrate 20, and disposed on the upper surface of the substrate 20 at a position proximate to a peripheral edge of the light-emitting element 1. The underfill 40 that is disposed between the second surface 3 of the light-emitting element 1 and the upper surface of the substrate 20 is separated from the second surface 3 of the light-emitting element 1 with a clearance 50. The underfill 40 that is disposed on the upper surface of the substrate 20 at the position proximate to the peripheral edge of the light-emitting element 1 is in contact with the lateral surface 4 of the light-emitting element 1 or the fillet 8A2.

Description will be made on the assumption that the light-emitting device 100 further includes, as one example, a light-reflective member 11 covering an upper surface of the substrate 20, a lateral surface of the adhesive resin 8, a lateral surface of the light-transmissive member 5, and an upper surface of the underfill 40 and includes a lens 30 provided on an upper surface of the light-transmissive member 5 facing the light-emitting element 1. Configurations of the light-emitting device 100 will be described below.

Light-Emitting Element

The light-emitting element 1 is formed into, for example, a cuboid shape by a first surface 2 serving as a light extracting surface, a second surface 3 opposite to the first surface 2 and serving as a bottom surface, the lateral surface 4 serving as a surface connecting the first surface 2 and the second surface 3. The light-emitting element 1 includes an element electrode 9 provided on the second surface 3. For the light-emitting element 1, a light-emitting diode including a semiconductor layer including an n-type semiconductor layer, a p-type semiconductor layer, and a light-emitting layer is preferably used, and the light-emitting diode with any wavelength suitable for the purpose and application can be selected. For example, for the light-emitting element 1 emitting blue light (light having a wavelength of 430 nm to 490 nm) or green light (light having a wavelength of 490 nm to 570 nm), ZnSe, a nitride-based semiconductor ($In_XAl_YGa_{1-X-Y}N$, $0 \leq X$, $0 \leq Y$, $X+Y \leq 1$), GaP, and the like can be used.

Furthermore, for the light-emitting element 1 emitting red light (light having a wavelength of 620 nm to 750 nm), GaAlAs, AlInGaP, and the like can be used. When a phosphor is used for the light-emitting device 100, a nitride-based semiconductor ($In_XAl_YGa_{1-X-Y}N$, $0 \leq X$, $0 \leq Y$, $X+Y \leq 1$) that can emit light with a short wavelength to efficiently excite the phosphor is preferably used. The composition, emitted light color, size, and the like of the light-emitting element 1 can be selected as appropriate in accordance with a purpose and application.

The element electrode 9 of the light-emitting element 1 includes a first element electrode **9*a* and a second element electrode 9*b* spaced from each other on the second surface 3. The light-emitting element 1 is configured such that the conductive member 10 is disposed on the element electrode 9 to create a predetermined gap or more between the second surface 3 of the light-emitting element 1 and the substrate 20**.

Conductive Member

The conductive member 10 is disposed on the element electrode 9 or the wiring 22 of the substrate 20 while electrically connecting to the element electrode 9 of the light-emitting element 1 and the wiring 22 of the substrate 20, to electrically conduct the light-emitting element 1 and the substrate 20. Here, the conductive member 10 includes a first conductive member **10*a* disposed on the first element electrode 9*a* and a second conductive member 10*b* disposed on the second element electrode 9*b***, for example.

Each of the first conductive member **10*a* and the second conductive member 10*b* is disposed so as to have an area equal to or greater than the area of the corresponding one of first element electrode 9*a* and the second element electrode 9*b*. For example, the first conductive member 10*a* and the second conductive member 10*b* are disposed so as to have a flattened substantially cuboid shape and include four lateral surfaces each formed by a flat vertical plane or a curved plane. For the conductive member 10**, it is possible to use a metal material made of an electrically conductive metal such as Cu or Au, or an alloy of Cu or Au or the like, for example.

For example, the conductive member 10 is disposed such that a distance from the upper surface of the substrate 20 to the second surface 3 of the light-emitting element 1 is in a range from 10 μm to 110 μm. When the distance created by the conductive member 10 is 10 μm or more, the clearance 50 is formed between the underfill 40 and the second surface 3 of the light-emitting element 1 as to be described below, so that the underfill 40 can be easily disposed. When the distance created by the conductive member 10 is 110 μm or less, the light-emitting element 1 can have a stable posture, and the underfill 40 as well as the clearance 50 between the underfill 40 and the second surface 3 of the light-emitting element 1 can be easily formed. The conductive member 10 can be formed on the second surface 3 of the light-emitting element 1 or the wiring 22 of the substrate 20, by plating, printing, or the like.

Light-Transmissive Member

For example, the light-transmissive member 5 is formed in a shape of a plate with a rectangular plan view and includes a wavelength conversion layer 6 including a phosphor, and a light-transmissive layer 7 having transmissivity and joined to the wavelength conversion layer 6. This light-transmissive member 5 absorbs at least a portion of light from the light-emitting element 1 and converts it into light with a different wavelength. The light-transmissive member 5 is disposed such that the wavelength conversion layer 6 faces the first surface 2 of the light-emitting element 1 through the adhesive resin 8, which will be described later. In addition, the light-transmissive member 5 includes a surface greater than the first surface 2 serving as a light extracting surface of the light-emitting element 1, and this surface is joined to the first surface 2 of the light-emitting element 1. That is, the outer edge of the light-transmissive member 5 is disposed in a size that is positioned outside the outer edge of the light-emitting element 1 in plan view.

As for the wavelength conversion layer 6, a formed product obtained by mixing and forming a light-transmissive material such as resin, glass, or an inorganic substance as a binder of the phosphor, for example, can be used. As for the binder, an organic resin binder such as epoxy resin, silicone resin, phenolic resin, or polyimide resin, or an inorganic binder such as glass, for example, can be used. In addition, as for the phosphor, an yttrium-aluminum-garnet-based phosphor (YAG-based phosphor) or the like that is a typical phosphor that can emit a white-based mixed color light when suitably combined with a blue light-emitting element, for example, can be used. Furthermore, in a case of achieving a light-emitting device 100 that can emit white light, the density of the phosphor included in the wavelength conversion layer 6 is adjusted so as to be able to emit white light. In addition, it is preferred to set the density of the phosphor to be, for example, approximately 5 mass % to 75 mass %. The density of the phosphor indicates the proportion of the phosphor in the total amount of the wavelength conversion layer 6 including the phosphor.

In addition, a blue light-emitting element is used for the light-emitting element 1, a YAG-based phosphor is used for the phosphor, and a nitride-based phosphor having a large amount of red color light emitting component is used. This makes it possible to emit amber-color light. The amber color corresponds to a region formed from a long wavelength region of yellow and a short wavelength region of yellowish red according to JIS Z 8110, to a chromaticity range of a region sandwiched between the yellow region and the yellowish red short wavelength region according to JIS Z 9101, which defines safety colors, and, for example, to a region of 580 nm to 600 nm in terms of the dominant wavelength.

The YAG-based phosphor is a generic term for a phosphor with a garnet structure containing Y and Al, is activated with at least one element selected from rare earth elements, and emits light when excited by light emitted from the light-emitting element 1. As for the YAG-based phosphor, $(Re_{1-x}Sm_x)_3(Al_{1-y}Ga_y)_5O_{12}$:Ce ($0 \leq x < 1$, $0 \leq y \leq 1$, where Re is at least one element selected from the group consisting of Y, Gd, and Lu) and the like, for example, can be used.

In addition, the nitride-based phosphor is a phosphor that is activated by a rare earth element of least one type or more selected from the group consisting of Y, La, Ce, Pr, Nd, Sm, Eu, Gd, Tb, Dy, Ho, Er, and Lu and that includes a group 2 element of at least one type or more selected from the group consisting of Be, Mg, Ca, Sr, Ba, and Zn, a group 4 element of at least one type or more selected from the group consisting of C, Si, Ge, Sn, Ti, Zr, and Hf, and N. Note that 0 can be included in the composition of this nitride-based phosphor.

The light-transmissive layer 7 is made of a light-transmissive material, for example, resin, glass, inorganic substance, or the like and is formed into a plate shape. This light-transmissive layer 7 has a size equivalent to the wavelength conversion layer 6 and is disposed such that the lower surface of the light-transmissive layer 7 abuts against the upper surface of the wavelength conversion layer 6 in plan view. As for the glass, borosilicate glass, quartz glass, and the like, for example, can be used. As for the resin, silicone resin, epoxy resin, and the like, for example, can be used. Note that the light-transmissive layer 7 can include a light-diffusion member. When the density of the phosphor of the wavelength conversion layer 6 increases, colors are more likely to be uneven. However, with a light-diffusion member being included in the light-transmissive layer 7, it is possible to suppress the uneven color and the nonuniformity in brightness. As for the light-diffusion member, titanium oxide, barium titanate, aluminum oxide, or silicon oxide, for example, can be used.

Note that description has been made by giving an example in which the light-transmissive member 5 includes two layers of the wavelength conversion layer 6 and the light-transmissive layer 7. Alternatively, three or more layers can be layered. The light-transmissive member 5 may only include a single layer that is the wavelength conversion layer 6 or the light-transmissive layer 7. In addition, the light-diffusion member can be added to the light-transmissive member 5 as needed. Furthermore, the thickness of the light-transmissive member 5 can be set, for example, in a range from 100 μm to 300 μm, preferably in a range from 150 μm to 250 μm. When the thickness of the light-transmissive member 5 is 300 μm or less, the heat dissipating property tends to be improved. For the sake of the heat dissipating property, the wavelength conversion layer 6 is preferably made thin as much as possible. On the other hand, when the thickness of the light-transmissive member 5 is 100 μm or more, light of a predetermined color can be emitted, and the mechanical strength can be maintained. By considering these factors, the light-transmissive member 5 is preferably set to have an appropriate thickness described above.

Adhesive Resin

A part of the adhesive resin 8 forms an adhesive layer 8A1 that causes the light-transmissive member 5 and the light-emitting element 1 to adhere to each other, and the other part of the adhesive resin 8 forms a fillet 8A2. For the adhesive resin 8 that constitutes the fillet 8A2, it is preferable to use a light-transmissive material that can effectively guide light exited from the light-emitting element 1 to the light-transmissive member 5 and also can optically couple the light-emitting element 1 and the light-transmissive member 5. As for the adhesive resin 8, an organic resin such as epoxy resin, silicone resin, phenolic resin, or polyimide resin, for example, can be used, and it is preferable to use the silicone resin, which has high heat resistance. Note that, as the thickness of the adhesive layer 8A1 formed between the light-emitting element 1 and the light-transmissive member 5 reduces, it is more preferable. This leads to an improvement in the heat dissipating property and also leads to a reduction in a loss of light that passes through the adhesive resin 8 between the light-emitting element 1 and the light-transmissive member 5. This improves the output of light of the light-emitting device 100. The index of refraction of the adhesive resin 8 is preferably lower than that of the light-emitting element 1 and higher than that of the light-transmissive member 5. The light exited from the light-emitting element 1 can be emitted to the outside through the adhesive resin 8 and the light-transmissive member 5 by setting the index of refraction to a predetermined relationship.

The fillet 8A2 is disposed between the peripheral edge of the lower surface of the light-transmissive member 5 and the lateral surface of the light-emitting element 1. It is preferable that the fillet 8A2 has a visible outline Si being substantially linear or convex curve toward the outside when viewed in cross section. The fillet 8A2 partially or entirely covers the lateral surface of the light-emitting element 1.

The excessive adhesive resin 8 other than the amount used for the adhesive layer 8A1 necessary to adhere the lower surface of the light-transmissive member 5 to the upper surface of the light-emitting element 1 is caused to extend up to the lateral surface of the light-emitting element 1, which enables the adhesive resin 8 to form the fillet 8A2. The triangular cross-sectional shape of the fillet 8A2 is formed at a position where the lower surface of the light-transmissive member 5 and the lateral surface 4 of the light-emitting element 1 meet each other at right angles in a continuous state from the adhesive layer 8A1. The triangle cross-sectional shape portion of the fillet 8A2 can be formed by optimizing the wettability or viscosity of the silicone resin or the like relative to the lateral surface of the light-emitting element 1 or the lower surface of the light-transmissive member 5.

In particular, the luminous flux can be increased by increasing the volume of the fillet 8A2 at the position of the lateral surface 4 of the light-emitting element 1 and at positions of four corners of the light-emitting element 1. Furthermore, the increase in luminous flux emitted from the light-emitting element 1 at each position can be uniform by making a state of the fillet 8A2 at the position of the lateral surface 4 of the light-emitting element 1 and a state of the fillet 8A2 at each of the positions of four corners of the light-emitting element 1 substantially equal.

Underfill

The underfill 40 is disposed on the upper surface of the substrate 20 at a portion proximate to the peripheral edge of the light-emitting element 1 and faces the second surface 3 of the light-emitting element 1. A first portion 41 of the underfill 40 facing the second surface 3 of the light-emitting element 1 is disposed with the clearance 50 between the second surface 3 of the light-emitting element 1 and the first portion 41. A second portion 42 of the underfill 40 disposed on the upper surface of the substrate 20 at the portion proximate to the peripheral edge of the light-emitting element is in contact with the lateral surface 4 of the light-emitting element 1 or the fillet 8A2. The first portion 41 of the underfill 40 is disposed below the second surface 3 of the light-emitting element 1 in a state where the first portion 41 is separated from the second surface 3 of the light-emitting element 1 with the clearance 50. The first portion 41 of the underfill 40 is dried at a temperature of 70° C. or lower in a step of manufacturing to be described below. As a result, the diluent included in the underfill 40 evaporates. Thus, the clearance 50 can be formed.

The second portion 42 of the underfill 40 is in contact with the lateral surface 4 of the light-emitting element 1 or the fillet 8A2. But the diluent included in the underfill 40 evaporates to the outside through the second portion 42 so that the first portion 41 forms the clearance 50. This is because the underfill 40 is dried at a temperature of 70° C. or lower, and thus the diluent can gradually evaporate to form the clearance 50 between the first portion 41 and the second surface 3 of the light-emitting element 1, even if the second portion 42 is occupying the space to the first portion 41. The second portion 42 of the underfill 40 also involves the evaporation of the diluent to have a height of the upper surface reduced after the drying.

A distance H1 of the clearance 50 from the upper surface of the first portion 41 of the underfill 40 to the second surface 3 of the light-emitting element 1 is set to be less than a distance H2 from the upper surface of the first portion 41 of the underfill 40 to the upper surface of the substrate 20. The distance H1 of the clearance 50 can be adjusted based on the amount of diluent to be included in the underfill 40. The distance H1 of the clearance 50 is an average distance of a region where the clearance 50 is formed. The distance H2 to the upper surface of the first portion 41 from the upper surface of the substrate 20 is an average distance of a region of the first portion 41. The distance H1 of the clearance 50 is preferably in a range from 1 μm to 55 μm, and preferably in a range from 3 μm to 30 μm. Preferably, the distance between the upper surface of the first portion 41 of the underfill 40 and the lower surface of the light-emitting element 1 is greater in an area near the center of the light-emitting element 1 than in an area near the outer edge of the light-emitting element 1. This is because the amount of heat generated is likely to be larger in the center area of the light-emitting element 1 than at the outer edge of the light-emitting element 1, and even when the thermal expansion amount of the underfill 40 is large in the center area of the light-emitting element 1, the light-emitting element 1 would not be lifted.

The second portion 42 of the underfill 40 is illustrated in FIG. 3 to be in contact with the fillet 8A2 but can be in direct contact with the lateral surface 4 of the light-emitting element 1, if the fillet 8A2 is disposed to cover a range up to the position of a part of the lateral surface 4 in the height direction of the lateral surface 4 of the light-emitting element 1 for example. An upper end position T2 of the second portion 42 of the underfill 40 is preferably at a position that is a half or less of a thickness of the light-emitting element 1 and is preferably at a position that is 1/10 or more of the thickness T1 of the light-emitting element 1. Thus, the underfill 40 is in contact with the fillet 8A2 or the lateral surface 4 of the light-emitting element 1 from the upper surface of the substrate 20.

The underfill 40 includes, for example, a resin material, a first light-reflective material, and the diluent. For example, epoxy resin, silicone resin, modified silicone resin, urethane resin, oxetane resin, acrylic resin, polycarbonate resin, polyimide resin, or the like can be used for the resin material of the underfill 40. The underfill 40 is preferably formed by using white resin having light reflectivity, obtained by including particles of the first light-reflective material in resin with good transmissivity such as silicone resin or epoxy resin. As for the first light-reflective materials, titanium oxide, aluminum oxide, zinc oxide, barium carbonate, barium sulfate, boron nitride, aluminum nitride, glass filler, and the like, for example, can be suitably used. The median diameter of the first light-reflective material is preferably 200 nm or less, more preferably 100 nm or less, and particularly preferably 50 nm or less. The underfill 40 can be disposed to a portion close to the center of the second surface 3 of the light-emitting element 1 without hindering the entrance of the underfill 40 into a space between the second surface 3 of the light-emitting element 1 and the upper surface of the substrate 20 by using powder of a predetermined size for the first light-reflective material.

Furthermore, this is because the underfill 40 can be provided with a reflection function based on Rayleigh scattering.

In the underfill 40, for example, a tridecane, an aromatic hydrocarbon-based solvent such as xylene, toluene, and benzene, an aliphatic hydrocarbon-based solvent such as heptane and hexane, a halogenated hydrocarbon-based solvent such as trichloroethylene, perchloroethylene, and methylene chloride, an ester-based solvent such as ethyl acetate, a ketone-based solvent such as methyl isobutyl ketone and methyl ethyl ketone, an alcohol-based solvent such as ethanol, isopropanol, and butanol, ligroin, cyclohexanone, diethyl ether, a rubber solvent, a silicone-based solvent, or the like is used for the diluent. The boiling point of the diluent is preferably in a range from 100° C. to 350° C., and is more preferably in a range from 150° C. to 300° C. It is possible to inhibit the diluent from starting to evaporate immediately after the underfill 40 is applied, by setting the boiling point of the diluent to 100° C. or higher. On the other hand, the evaporation can be accelerated at relatively low temperatures, when the boiling point of the diluent is set to 350° C. or lower. Note that the diluent with the boiling point in the range described above can be used, or another solvent or the like can be mixed into the diluent to achieve the range described above.

Here, tridecane is used as the diluent of the underfill 40 as an example. This tridecane is included in the underfill 40 such that the weight ratio of tridecane to the resin material becomes in a range from 25 phr to 150 phr. When the weight ratio of tridecane to the resin material is 25 phr or more, it becomes easier to make the distance H1 of the clearance 50 of the first portion 41 less than the distance H2 from the upper surface of the substrate 20 to the upper surface of the first portion 41, through the drying at a temperature of 70° C. or lower in the manufacturing method to be described below. When the weight ratio of the tridecane to the resin material is 150 phr or less, the clearance 50 can be easily formed without the gap between the second surface 3 of the light-emitting element 1 and the outside, through the drying at a temperature of 70° C. or lower in the manufacturing method to be described below. In particular, by using tridecane, the first portion 41 of the underfill 40 can be easily disposed so as to form the clearance 50 on the first portion 41 of the underfill 40 even when the second portion 42 of the underfill 40 is present. Thus, the lower limit of the weight ratio of the diluent to the resin material in the underfill 40 is 25 phr or more, preferably 30 phr or more, and more preferably 35 phr or more. The upper limit of the weight ratio of the diluent to the resin material in the underfill 40 is 150 phr or less, preferably 145 phr or less, and more preferably 140 phr or less.

The underfill 40 is preferably a member with a lower thermal stress than the light-reflective member 11. The underfill 40 with a lower thermal stress than the light-reflective member 11 has a low elasticity (soft), meaning that the cracks are less likely to be formed and the light extraction efficiency can be maintained. The underfill 40 and the adhesive resin 8 can be formed by the same material. When the underfill 40 and the adhesive resin 8 are formed by the same material, the adhesive strength can be improved in a portion where the underfill 40 and the adhesive resin 8 are in contact with each other. Furthermore, the type of material used in the step of manufacturing can be reduced.

Light-Reflective Member

The light-reflective member 11 covers the upper surface of the substrate 20, the lateral surface of the adhesive resin 8, the lateral surface of the light-transmissive member 5, and the upper surface of the second portion 42 of the underfill 40 at a position proximate to the peripheral edge of the light-emitting element 1 and exposes the upper surface of the light-transmissive member 5. This light-reflective member 11 is used to reflect light from the light-emitting element 1. The light-reflective member 11 can allow light exited from the light-emitting element 1 to enter the wavelength conversion layer 6 of the light-transmissive member 5. More specifically, the light-reflective member 11 covers the second portion 42 of the underfill 40 disposed on the upper surface of the substrate 20 at a position proximate to the peripheral edge of the light-emitting element 1, as well as the lateral surface of each of the light-transmissive member 5 and the fillet 8A2. Furthermore, the light-reflective member 11 is formed so as to slope gently downward from the upper end edge of the light-transmissive member 5 toward the outside when viewed in cross section and constitutes a portion of the lateral surface of the light-emitting device 100. The light-reflective member 11 is disposed such that when viewed in cross section, the position of the light-reflective member 11 is higher than a flat plate portion 32 of the lens 30 to be described later, at a portion proximate to the upper end edge of the light-transmissive member 5 and gradually continues to the lower end surface of the flat plate portion 32 of the lens 30.

It is preferable to use an insulating material for the light-reflective member 11. Alternatively, thermosetting resin, thermoplastic resin, or the like can be used in order to ensure the strength to a certain degree. The light-reflective member 11 can be formed, for example, by using resin including one or more of silicone resin, modified silicone resin, epoxy resin, modified epoxy resin, acrylic resin, phenolic resin, bismaleimide triazine resin (BT resin), and polyphthalamide resin (PPA), or by using a hybrid resin and a second light-reflective material. Among these materials, it is preferable to use resin including, as a base polymer, silicone resin exhibiting good heat resistance properties and electrically insulating properties and having flexibility. The light-reflective member 11 includes the second light-reflective material.

Examples of the second light-reflective material include titanium oxide, silicon oxide, zirconium oxide, magnesium oxide, calcium carbonate, calcium hydroxide, calcium silicate, zinc oxide, barium titanate, potassium titanate, alumina, aluminum nitride, boron nitride, mullite, and the like. Among these materials, titanium oxide is preferable because it is relatively stable in terms of moisture or the like and has high index of refraction. The median diameter of the second light-reflective material is preferably in a range from 500 nm to 5 μm, is more preferably in a range from 700 nm to 3 μm, and is particularly preferably in a range from 900 nm to 2 μm. This is because the light from the light-emitting element 1 can be scattered by Mie scattering and extracted upward efficiently by using powder of a predetermined size for the second light-reflective material. The light-reflective member 11 is preferably a member with a higher reflectivity than the underfill 40. The light-reflective member 11 being a member with a higher reflectivity than the underfill 40 can contribute to improvement of the light extraction efficiency through reflection of the light reflected by the underfill 40 or the light transmitted through the underfill 40.

Substrate

The substrate 20 is used to place members that constitute the light-emitting device 100. Here, the substrate 20 is configured such that the wiring (electroconductive pattern) 22 for electrical connection with the conductive member 10, which is disposed on the element electrode 9 of the light-emitting element 1, is disposed on the upper surface of a base body 21, and an external connection electrode (electroconductive pattern) 23 for electrically connecting an external power supply and the light-emitting device 100 is formed on the lower surface of the base body 21 in a state insulated and isolated into a positive electrode 23*a* and a negative electrode 23*b*. In addition, here, the substrate 20 includes a heat dissipating plate 24 disposed between the positive electrode 23*a* and the negative electrode 23*b* so as to be spaced apart from them. In the substrate 20, the wiring 22 and the external connection electrode 23 are electrically connected through via wiring or the like that is not illustrated in the drawing.

As for the material of the base body 21 of the substrate 20, it is preferable to use an insulating material that is less likely to allow light from the light-emitting element 1 or outside light to pass through, and ceramic such as alumina, aluminum nitride, and LTCC or a resin material such as phenolic resin, epoxy resin, polyimide resin, bismaleimide triazine resin, and polyphthalamide resin, for example, can be used. In addition, it is also possible to use a composite material of an insulating material and a metal member. Note that, in a case in which resin is used as a material of the base body 21 of the substrate 20, it may be possible to mix resin with an inorganic filler such as glass fiber, silicon oxide, titanium oxide, and alumina as necessary. As a result, the mechanical strength can be improved, the thermal expansion coefficient can be reduced, and the light reflectance can be improved. Note that no specific limitation is applied to the thickness of the substrate 20, and it may be possible to form the substrate so as to have any given thickness in accordance with the object and application.

Lens Portion

The lens 30 is disposed on the upper surface of the light-transmissive member 5. The lens 30 is formed into a plano-convex lens having a hemispherical shape with a curved surface protruding upward. The lens 30 includes a convex lens portion 31 having a hemispherical shape and a flat plate portion 32 continuing to the lower end of the convex lens portion 31. The lens center of this lens 30 is disposed so as to align with the element center of the light-emitting element 1 in plan view. Furthermore, the flat plate portion 32 is formed so as to have a rectangular shape in plan view, is formed so as to be larger than the convex lens portion 31, and is formed in a size that substantially matches the shape of the substrate 20 in plan view. Position of the flat plate portion 32 in the height direction is lower than the upper surface of the light-transmissive member 5. Thus, light traveling in the horizontal direction from the upper end surface of the light-transmissive member 5 is emitted from a portion of the convex lens portion 31 of the lens to the outside.

The lens 30 outputs light from the light-emitting element 1 to the outside of the light-emitting device 100 through the convex lens portion 31. The lens 30 can collect and output light from the light-emitting element 1 upward.

Examples of the material of the lens 30 include translucent resins having good weather resistance such as urethane resins, methacrylate resins, polymethylmethacrylate resins, diallylcarbonate resins, carbonate-based resins, epoxy resins, and silicone resins, and glass. The lens 30 is a member having transmissivity, or a transparent body. The lens 30 can contain a filler such as a diffusing member. It is possible to change light distribution characteristics and suppress light emission unevenness, by including the filler in the lens 30. Examples of the filler include barium titanate, titanium oxide, aluminum oxide, and silicon oxide. Although median diameter of the filler is not particularly limited, it is preferably in a range from 5 nm to 5 μm and is more preferably in a range from 10 nm to 3 μm. The lens 30 can include a coloring agent. For example, the lens 30 including a blue coloring agent can achieve a light-emitting device 100 that emits blue light, the lens 30 including a green coloring agent can achieve a light-emitting device 100 that emits green light, and the lens 30 including a red coloring agent can achieve a light-emitting device 100 that emits red light. It is possible to manufacture a light source device that can provide full-color display by using these light-emitting devices 100 of three colors.

As for the coloring agent, copper phthalocyaninato, C.I. pigment green 36, or N,N'-dimethyl-3,4:9,10-perylenebisdicarbimide can be used. In addition, as the coloring agent, a coloring agent including either one of a pigment and a dye can be used.

No specific limitation is applied to the pigment. However, an example of the pigment includes a pigment using an inorganic material or organic material.

Note that it is preferable to use a pigment or a dye that basically does not convert light from the light-emitting element 1 into light having a different wavelength. As will be described later, the reason for using this configuration is to avoid exerting a huge influence on a wavelength conversion member in a case in which a pigment and a dye are included in the wavelength conversion member.

The lens 30 can include a light stabilizer. Examples of the light stabilizer include a benzotriazole-based, a benzophenone-based, salicylate-based, cyanoacrylate-based, or hindered amine-based light stabilizer.

Operation of Light-Emitting Device

In a semiconductor device known in the art in which a semiconductor element is face-down mounted on a substrate via solder bumps, an underfill is disposed between a lower surface of the semiconductor element and an upper surface of the substrate. The underfill is in contact with both the lower surface of the semiconductor element and the upper surface of the substrate. Such a configuration is for transferring heat from the semiconductor element toward the substrate and improving the heat dissipation characteristics. However, when the amount of heat generated by the semiconductor element increases as the semiconductor element is driven, the underfill can be thermally expanded to lift the semiconductor element. When the semiconductor element is lifted, a crack may be formed in the solder bump that fixes the semiconductor element and the substrate to result in a higher electric resistance. When the crack grows, it may even cause short circuiting.

On the other hand, when the light-emitting device 100 according to the present embodiment is driven, an electric current is supplied from an external power source through the external connection electrode 23 to the light-emitting element 1, and the light-emitting element 1 emits light. The wavelength of the light directed upward from the light-emitting element 1 is converted by the wavelength conversion layer 6 of the light-transmissive member 5 and, for example, is output through the convex lens portion 31 to the outside as white light. In addition, because the upper end surface of the light-transmissive member 5 is located inside the convex lens portion 31 in the height direction, the light directed in the horizontal direction from the light-emitting element 1 is reflected by the light-reflective member 11 to be incident on the light-transmissive member 5 and is output to the outside through the convex lens portion 31. In the light-emitting element 1, the first portion 41 of the underfill 40 is disposed with the clearance 50. Thus, the first portion 41 of the underfill 40 does not press the second surface 3 of the light-emitting element 1 even when the light-emitting element 1 generates heat or is heated by reflow or the like during the manufacturing. Thus, electrical connection between the light-emitting element 1 and the substrate 20 is guaranteed, and the light-emitting device 100 with high reliability can be configured.

The underfill 40 covers a part of the lateral surface 4 of the light-emitting element 1 or the adhesive resin 8 disposed on the lateral surface 4 of the light-emitting element 1, so that the light-reflective member 11 will not flow into the clearance 50 formed between the second surface 3 of the light-emitting element 1 and the underfill 40. That is, the clearance 50 is hermetically sealed with the underfill 40 and the light-emitting element 1, and with the adhesive resin 8 in some cases. The underfill 40 does not lift the light-emitting element 1 even when the underfill 40 is expanded due to the heat generated by the light-emitting element 1 as the light-emitting device 100 is driven, by the clearance 50 being hermetically sealed. Thus, the fixing of the conductive member 10, which connects the light-emitting element 1 and the substrate 20, can be maintained, and the light-emitting device 100 with high reliability can be provided. That is, the light-emitting device 100 can be provided that allows stress under thermal expansion of an underfill to be relaxed.

Modification Example 1

Figure 4:
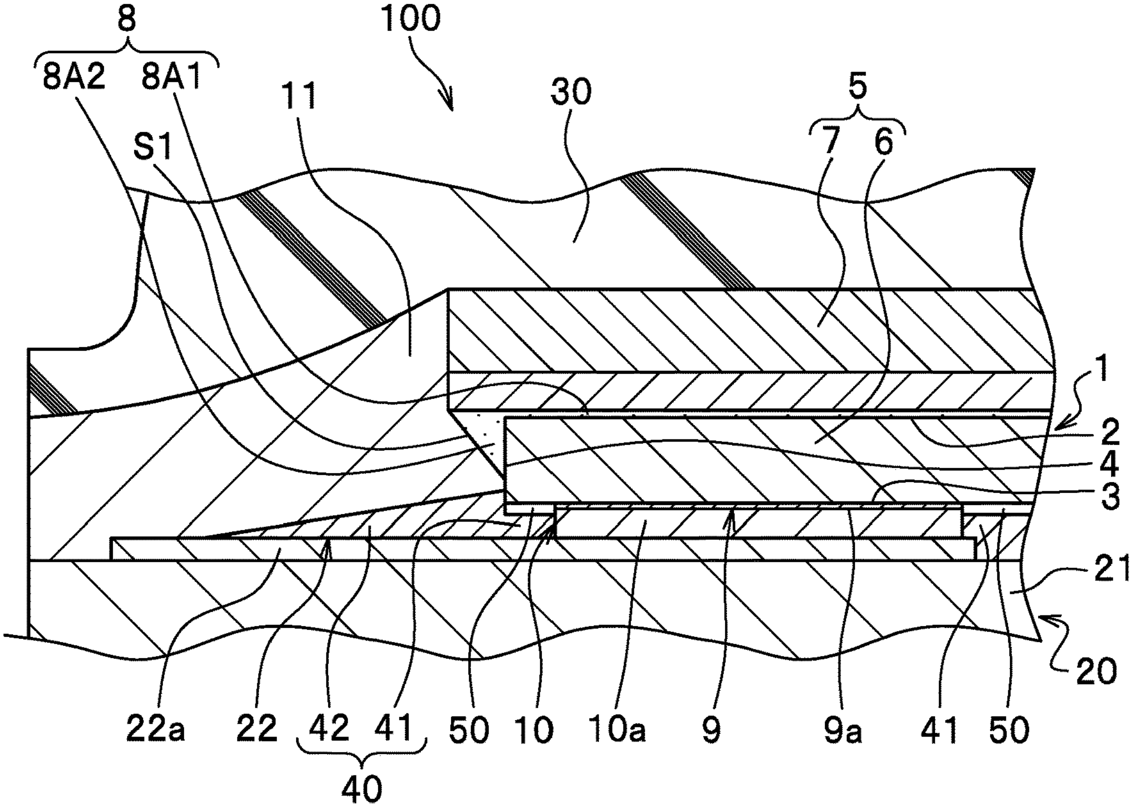
FIG. 4 is a cross-sectional view illustrating Modification Example 1 of an underfill according to the first embodiment.

Modification Example 1 of the underfill 40 will be described with reference to FIG. 4. FIG. 4 is a cross-sectional view illustrating Modification Example 1 of the underfill of the light-emitting device according to the first embodiment. Note that the same reference characters are attached to the configurations that have been already described in FIGS. 1 to 3, and explanation thereof will be omitted as appropriate. The second portion 42 of the underfill 40 can be in contact with the lateral surface 4 of the light-emitting element 1. That is, the second portion 42 of the underfill 40 is in direct contact with the lateral surface 4 of the light-emitting element 1 without being in contact with the fillet 8A2. An upper end of the second portion 42 of the underfill 40 can be located adjacent to a lower end of the fillet 8A2.

Modification Example 2

Figure 5:
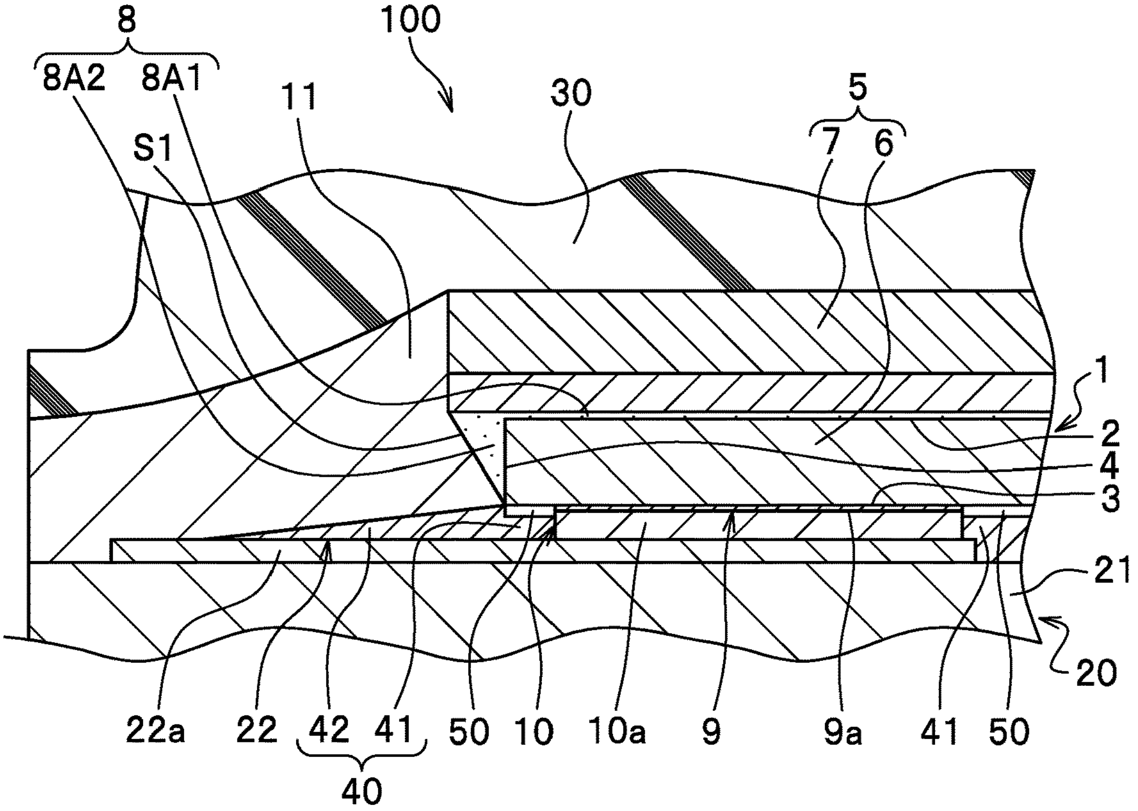
FIG. 5 is a cross-sectional view illustrating Modification Example 2 of the underfill according to the first embodiment.

Modification Example 2 of the underfill 40 will be described with reference to FIG. 5. FIG. 5 is a cross-sectional view illustrating Modification Example 2 of the underfill of the light-emitting device according to the first embodiment. Note that the same reference characters are attached to the configurations that have been already described above, and explanation thereof will be omitted as appropriate.

The second portion 42 of the underfill 40 can be in contact with a corner portion that is a boundary between the lateral surface 4 and the second surface 3 of the light-emitting element 1. It is supposed that the fillet 8A2 is disposed entirely over the lateral surface 4 of the light-emitting element 1. Alternatively, the fillet 8A2 can be disposed at part of the lateral surface of the light-emitting element 1 (see FIG. 4). In order to dispose the second portion 42 of the underfill 40 so as to be in contact with the corner portion that is a boundary between the lateral surface 4 and the second surface 3 of the light-emitting element 1, the underfill 40 needs to be disposed expecting in advance that the height thereof decreases due to the evaporation of the diluent. The functions of the fillet 8A2 and the underfill 40 can be fully utilized by the upper end of the second portion 42 of the underfill 40 being positioned at the corner portion that is a boundary between the lateral surface 4 and the second surface 3 of the light-emitting element 1.

Method for Manufacturing Light-Emitting Device

Figure 6:
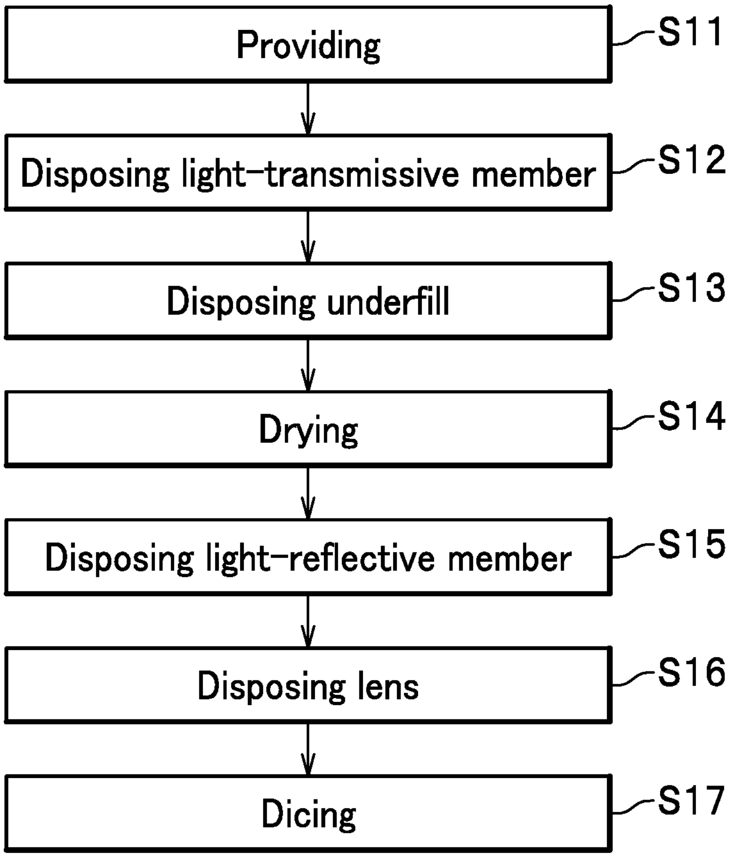
FIG. 6 is a flowchart illustrating a method for manufacturing the light-emitting device according to the first embodiment.

The method for manufacturing the light-emitting device according to the embodiment will be described with reference to FIG. 6. FIG. 6 is a flowchart illustrating a method for manufacturing a light-emitting device.

A method for manufacturing a light-emitting device 100 includes a step S11 of providing a light-emitting element disposed substrate where an element electrode 9 and a substrate 20 are electrically joined through a conductive member 10 by providing a light-emitting element 1 including a first surface 2 serving as a light extracting surface, a second surface 3 opposite to the first surface 2, and a lateral surface 4 connecting the first surface 2 and the second surface 3 and including the element electrode 9 disposed on the second surface 3 and by providing the substrate 20, a step S12 of disposing a light-transmissive member including a lateral surface at a position outward from the lateral surface 4 of the light-emitting element 1 by disposing an adhesive resin 8 on the first surface 2 of the light-emitting element 1, a step S13 of disposing an underfill 40 at a position on the substrate 20 proximate to a peripheral edge of the light-emitting element 1 and at a position on the substrate 20 facing the second surface 3 of the light-emitting element 1, a step S14 of drying the substrate 20 where the underfill 40 is disposed at a temperature of 70° C. or lower, and a step S15 of disposing a light-reflective member directly or indirectly covering the substrate 20 and the light-emitting element 1. The step of disposing the light-transmissive member 5 includes disposing the adhesive resin 8 between the first surface 2 of the light-emitting element 1 and the light-transmissive member 5 and disposing the adhesive resin 8 on at least a part of the lateral surface 4 of the light-emitting element 1. The underfill 40 is disposed in a state where the underfill 40 is in contact with the lateral surface 4 of the light-emitting element 1 or the adhesive resin 8 disposed on the lateral surface 4 of the light-emitting element 1 and is disposed on the substrate 20 in a state where the underfill 40 is separated from the second surface 3 of the light-emitting element 1 with a clearance 50 by the step S14 of drying.

In summary, the method for manufacturing a light-emitting device according to the embodiment includes (1) the step S11 of providing, (2) the step S12 of disposing the light-transmissive member, (3) the step S13 of disposing the underfill, (4) the step S14 of drying; and (5) the step S15 of disposing the light-reflective member.

Note that the method for manufacturing the light-emitting device is described as further performing a step S16 (step of disposing a lens) of disposing the lens 30 having a curved surface protruding upward on an upper surface of the light-transmissive member after the step S15 of disposing the light-reflective member, followed by a step S17 of dicing the light-emitting device 100 into a piece for each lens 30.

(1) Step of Providing Light-Emitting Element Disposed Substrate

The step S11 of providing is a step of providing the light-emitting element disposed substrate where the element electrode 9 and the substrate 20 are electrically joined through the conductive member 10 by providing the light-emitting element 1 including the first surface 2 serving as the light extracting surface, the second surface 3 opposite to the first surface 2, the lateral surface 4 connecting the first surface 2 and the second surface 3 and including the element electrode 9 disposed on the second surface 3 and by providing the substrate 20. In the step S11 of preparing, the conductive member 10 is disposed on the element electrode 9 of the light-emitting element 1 so that the combined height of the element electrode 9 and conductive member 10 is in a range from 10 μm to 110 μm, for example, by screen printing. The light-emitting element 1 used here includes the element electrode 9 provided on the second surface 3 that is to be a rear surface and has a rectangular shape in plan view. The substrate 20 is provided with via wiring in a thickness direction, the wiring 22 connecting to the light-emitting element 1 on an upper surface, and the external connection electrode 23 and the heat dissipating plate 24 on a lower surface. In addition, the conductive member 10 disposed on the element electrode 9 of the light-emitting element 1 is connected to the wiring 22 of the substrate 20 through an electrically conductive adhesive member to provide a light-emitting element disposed substrate. For example, the light-emitting element disposed substrate includes a region where a plurality of light-emitting devices 100 are integrated by connecting a plurality of light-emitting elements 1. In the light-emitting element disposed substrate, the light-emitting elements 1 are in a state of being arrayed in the row and column directions at predetermined intervals. The conductive member 10 can be disposed on the element electrode 9 of the light-emitting element 1 in advance or can be disposed on the wiring 22 of the substrate 20 in advance.

(2) Step of Disposing Adhesive Resin

The step of disposing an adhesive resin is a step of disposing the adhesive resin 8 on the first surface 2 serving as a light extracting surface of the light-emitting element 1. In the step, an appropriate amount of the adhesive resin 8 is dropped by a supplying device including a nozzle, onto the first surface 2 of the light-emitting element 1 of the light-emitting element disposed substrate. Note that the nozzle of the supplying device moves in the row and column directions to drop the adhesive resin 8 onto the first surfaces 2 of the plurality of light-emitting elements 1. Alternatively, the light-emitting element disposed substrate placed on the placing table is moved by a movement mechanism of the placing table, and the adhesive resin 8 is dropped onto the first surface 2 of each of the plurality of light-emitting elements 1 arrayed in the row and column directions. Note that the viscosity of and the amount of drop of the adhesive resin 8 to be dropped is set in advance. As an example, the amount of drop of the adhesive resin 8 is preferably an amount with which a visible outline S1 of the fillet 8A2 forms a convex curved line or substantially linear shape toward the outside, when viewed in cross section, without making the adhesive resin 8 leak off on the substrate, at portions of four sides and four corners of the light-emitting element 1. Furthermore, in this step, in order to facilitate the fillet 8A2 at the corner portion of the light-emitting element 1 being equivalent to the fillet 8A2 on the lateral surface 4 of the light-emitting element 1 when viewed in cross section, it is preferable that the adhesive resin having been dropped onto the first surface 2 of the light-emitting element 1 forms an x shape and that an appropriate amount of a part of the adhesive resin 8 is disposed at each of the positions closer to the four corner portions of the light-emitting element 1. Note that the step of disposing the adhesive resin and the subsequent step S12 of disposing the light-transmissive member can be performed in series.

(3) Step of Disposing Light-Transmissive Member

The step S12 of disposing the light-transmissive member is a step of disposing the light-transmissive member 5 on the adhesive resin 8 disposed on the first surface 2 of the light-emitting element 1. In the step 12, it is preferable to use the light-transmissive member 5 in a state in which the light-transmissive layer 7 and the wavelength conversion layer 6 are joined to each other in advance. Note that, the light-transmissive layer 7 and the wavelength conversion layer 6 are formed by applying a wavelength conversion member including a phosphor to a plate-like member having transmissivity through a printing method, and the light-transmissive member 5 is obtained by dicing the light-transmissive layer 7 and the wavelength conversion layer 6 and can be disposed on the first surface 2 of the light-emitting element 1. As an example, the light-transmissive member 5 having a larger area than that of the first surface 2 of the light-emitting element 1 and having a size such that a lateral surface of the light-transmissive member 5 is positioned outward from the lateral surface 4 of the light-emitting element 1, is used.

In the step S12, the light-transmissive member 5 is picked up by using a handler or the like to be disposed one by one on the first surface 2 of the light-emitting element 1 while being pressed with a predetermined pressure, and then, is dried. The light-transmissive member 5 is disposed through this step S12, and thus the adhesive layer 8A1 is formed between the lower surface of the light-transmissive member 5 and the first surface 2 of the light-emitting element 1 by the adhesive resin 8. The fillet 8A2 is formed by the adhesive resin 8 connecting to the peripheral edge of the lower surface of the light-transmissive member 5 and the lateral surface 4 of the light-emitting element 1. Note that the fillet 8A2 is preferably disposed in a state where the cross-section area is substantially equal at the position of the lateral surface 4 of the light-emitting element 1 and the position of the corner of the light-emitting element 1.

(4) Step of Disposing Underfill

The step S13 of disposing the underfill is a step of disposing the underfill 40 around the peripheral edge of the light-emitting element 1 as well as at a position facing the second surface 3 of the light-emitting element 1. In the step S13, the underfill 40 is disposed as the second portion 42 of the underfill 40 that covers the upper surface of the substrate 20 at a position proximate to the peripheral edge of the light-emitting element 1, and the first portion 41 of the underfill 40 facing the second surface 3 of the light-emitting element 1. For example, the second portion 42 of the underfill 40 is in contact with the fillet 8A2 that covers the lateral surface 4 of the light-emitting element 1. The first portion 41 of the underfill 40 is in contact with or in the vicinity of the second surface 3 of the light-emitting element 1. When the underfill 40 is dried in the subsequent step, tridecane, which is the diluent included therein, evaporates and the volume of the underfill 40 decreases. Thus, the underfill 40 is disposed while taking into account the decrease in volume.

The underfill 40 used herein includes the resin material, the first light-reflective material, and the diluent as described above. In the underfill 40, the weight ratio of the diluent used to the resin material is in a range from 25 phr to 150 phr. Preferably, the boiling point of the diluent used is in a range from 100° C. to 350° C. As an example, tridecane is used for the diluent. Here, the underfill 40 is applied from a nozzle so as to be disposed at a predetermined position on the substrate 20. When the weight ratio of the diluent is lower than 25 phr, fluidity becomes low to make the application from the nozzle difficult. When the weight ratio of the underfill 40 exceeds 150 phr, a gap can be formed between the second surface 3 of the light-emitting element 1 and the outside due to a large volumetric shrinkage. For example, the underfill 40 and the adhesive resin 8 are formed by the same material. Thus, the underfill 40 can be disposed on the substrate 20 by changing the type (such as shape and size) of a resin ejection part of the device for disposing the adhesive resin 8 and the resin ejection position. The second portion 42 of the underfill 40 is disposed with a part of the underfill 40 disposed on the upper surface of the substrate 20 at the position proximate to the peripheral edge of the light-emitting element 1 crawling upward along the lateral surface 4 of the light-emitting element 1.

(5) Step of Drying

The step S14 of drying is a step of drying the substrate 20 on which the underfill 40 is disposed, at a temperature of 70° C. or lower. In the step S14, the substrate 20 on which the underfill 40 is disposed is dried at a temperature of 70° C. or lower to gradually evaporate tridecane, which is the diluent included in the underfill 40, so that the clearance 50 can be formed between the underfill 40 and the second surface 3 of the light-emitting element 1. Although the first portion 41 of the underfill 40 is surrounded by the second portion 42 of the underfill 40, slow drying at a temperature of 70° C. or lower makes the diluent evaporate to form the clearance 50. The first portion 41 of the underfill 40 is formed by drying to be in a state where the distance from the upper surface of the first portion 41 to the second surface 3 of the light-emitting element 1 is less than the distance from the upper surface of the substrate 20 to the upper surface of the first portion 41. Thus, the clearance 50 is a gap smaller than the thickness of the first portion 41 of the underfill 40 from the substrate 20. The light-emitting element disposed substrate is dried using an existing drying facility such as an electric furnace.

In the step S14 of drying, a period during which the substrate 20 on which the underfill 40 is disposed is heated to a predetermined temperature is preferably at least 10 minutes or more, more preferably 30 minutes or more, and even more preferably an hour or more. This is because the sealed clearance 50 is formed with the temperature slowly raised as described above. A period during which the substrate 20 on which the underfill 40 is disposed is heated to a predetermined temperature is preferably five hours or less, more preferably three hours or less, and even more preferably two hours or less. This is because the work efficiency can be improved while forming the airtight clearance 50 with this configuration. The period during which the raised temperature drops to a room temperature is not particularly limited but is preferably in a range from 10 minutes to 10 hours, is more preferably in a range from 30 minutes to five hours, and is even more preferably in a range from an hour to three hours.

In the step S14 of drying, an atmosphere in which the substrate 20 on which the underfill 40 is disposed is dried is not particularly limited but is preferably non-oxygen atmosphere such as nitrogen atmosphere or inert atmosphere or hypoxic atmosphere. This is because it is not preferable to bring an easily oxidized member such as wiring into contact with oxygen for a long period of time.

(6) Step of Disposing Light-Reflective Member

The step S15 of disposing the light-reflective member is a step of disposing the light-reflective member 11 that directly or indirectly covers the substrate 20 and the light-emitting element 1. In the step S15, for example, at the upper side of the substrate 20 that has been fixed, resin or the like that constitutes the light-reflective member 11 is filled such that the upper surface of the light-transmissive member 5 is exposed, by using a (movable) resin discharging device that can move in the vertical direction, the horizontal direction, or the like relative to the substrate 20. When the light-reflective member 11 is disposed, the light-reflective member 11 does not enter a space proximate to the second surface 3 of the light-emitting element 1, because the underfill 40 is disposed at the peripheral edge of the lateral surface 4 of the light-emitting element 1.

(7) Step of Disposing Lens

The step S16 of disposing a lens is a step of mounting the lens 30 having a curved surface protruding upward on the upper surface of the light-transmissive member 5. In the step S16, the lower surface of the flat plate portion 32 of the lens 30 is adhered to the upper surface of the light-transmissive member 5 through an adhesive having transmissivity. The lens 30 can include pigments and dyes. With this configuration, the lens 30 may be able to emit light of three primary colors that are red, green, and blue, for example. In a case in which pigments and dyes are included in the lens 30, they are included in an amount not largely affecting the wavelength conversion member.

Note that, after the end of the step S16, a step S17 of dicing is performed to perform cutting for each lens 30, and the light-emitting device 100 is manufactured.

In the method for manufacturing the light-emitting device 100, the underfill 40 is dried at a temperature that is 70° C. or lower. Thus, the clearance 50 can be formed between the first portion 41 of the underfill 40 and the second surface 3 of the light-emitting element 1, with the second portion 42 of the underfill 40 being in contact with the lateral surface 4 of the light-emitting element 1 or the fillet 8A2 from the peripheral edge of the light-emitting element 1. Thus, even if the light-emitting device 100 is heated by reflow or the like, it is possible to suppress the underfill from pushing up the light-emitting element 1 due to thermal expansion of the underfill and causing a defect of the light-emitting element 1. Thus, the light-emitting device 100 with high reliability can be provided.

Note that in the step S13 of disposing the underfill, the underfill 40 can be in contact with the lateral surface 4 of the light-emitting element 1 or in contact with the corner portion of the light-emitting element 1 that is the boundary between the lateral surface 4 and the second surface 3 of the light-emitting element 1.

Second Embodiment

Figure 7:
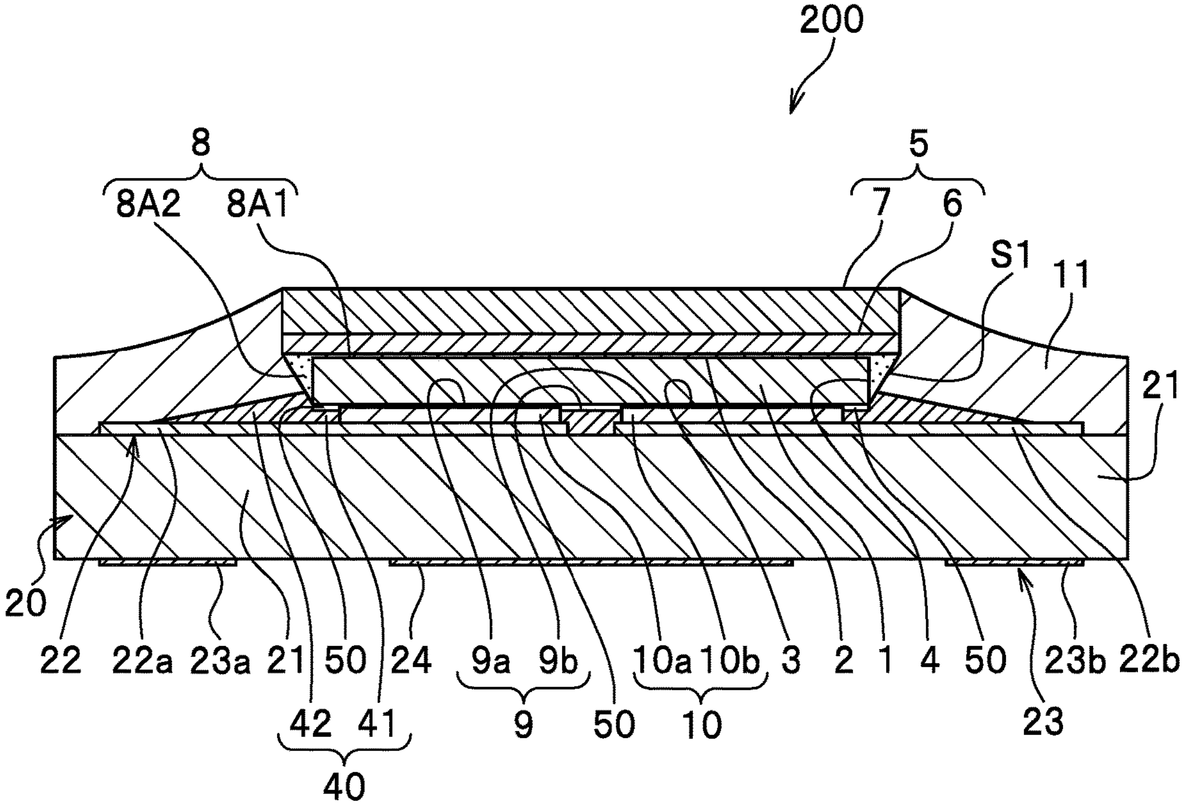
FIG. 7 is a cross-sectional view schematically illustrating a light-emitting device according to a second embodiment.

A light-emitting device 200 according to a second embodiment will be described with reference to FIG. 7. FIG. 7 is a cross-sectional view schematically illustrating a light-emitting device according to the second embodiment. Note that the same reference characters are attached to the configurations that have been described above, and explanation thereof will be omitted as appropriate.

The light-emitting device 200 does not include the lens 30, as compared with the configuration of the light-emitting device 100 according to the first embodiment. The light-emitting device 200 includes a light-emitting element 1 including a first surface 2 serving as a light extracting surface, a second surface 3 opposite to the first surface 2, and a lateral surface 4 connecting the first surface 2 and the second surface 3 and including an element electrode 9 provided on the second surface 3, a conductive member 10 disposed on the element electrode 9, a substrate 20 including wiring 22 connecting to the conductive member 10, a light-transmissive member 5 that allows light from the light-emitting element 1 to pass through, an adhesive resin 8 that is disposed between the first surface 2 of the light-emitting element 1 and the light-transmissive member 5, an underfill 40 that is disposed between the second surface 3 of the light-emitting element 1 and an upper surface of the substrate 20 and disposed on the upper surface of the substrate 20 at a position proximate to a peripheral edge of the light-emitting element 1, and a light-reflective member 11 that covers the upper surface of the substrate 20, a lateral surface of the adhesive resin 8, a lateral surface of the light-transmissive member 5, and an upper surface of a second portion 42 of the underfill 40 at a position proximate to the peripheral edge of the light-emitting element 1 and is disposed to expose an upper surface of the light-transmissive member 5.

A first portion 41 of the underfill 40 is separated from the second surface 3 of the light-emitting element 1 with a clearance 50. The second portion 42 of the underfill 40 is in contact with the lateral surface of the light-emitting element 1 or a fillet 8A2. The second portion 42 of the underfill 40 can be in contact with the lateral surface 4 of the light-emitting element 1 or can be in contact with a corner portion that is a boundary between the lateral surface 4 and the second surface 3 of the light-emitting element 1.

Note that, in the method for manufacturing the light-emitting device 200, the steps S11 to S15 that have been described above are performed, and then, a step S17 of dicing is performed. This makes it possible to perform manufacturing.

As described above, in the light-emitting device 100 and 200, the clearance 50 is formed between the first portion 41 of the underfill 40 and the second surface 3 of the light-emitting element 1. Thus, even if the substrate 20 is heated by reflow or the like, the second surface 3 of the light-emitting element 1 would not be lifted by the first portion 41 of the underfill 40 due to thermal expansion.

The fillet 8A2 can be disposed to have the fillet outer edge forming a visible outline of a curved line concaved inward when viewed in cross section. The conductive member 10 can be a bump configuration in which two or more conductive members 10 are formed on each element electrode 9 of the light-emitting element 1.

The light-emitting device and the light source device according to the embodiments of the present disclosure can be suitably used for a display for outdoor use. In addition, the light-emitting device and the light source device according to the embodiments of the present disclosure can be used for a backlight source of a liquid crystal display, various types of lighting fixtures, a display for indoor use, various types of display devices for advertisements, destination information, and the like.

The invention claimed is:

1. A light-emitting device comprising:

a light-emitting element including a first surface serving as a light extracting surface, a second surface serving as a bottom surface on which an element electrode is provided, and a lateral surface connecting the first surface and the second surface;

a light-transmissive member that is disposed on the first surface of the light-emitting element and allows light from the light-emitting element to pass through;

an adhesive resin forming an adhesive layer between the first surface of the light-emitting element and the light-transmissive member, the adhesive resin forming a fillet on at least a part of the lateral surface of the light-emitting element;

a substrate including wiring electrically connecting to the element electrode;

a conductive member connected to the element electrode of the light-emitting element and the wiring of the substrate; and an underfill disposed between the second surface of the light-emitting element and an upper surface of the substrate, the underfill being disposed on the upper surface of the substrate at a position proximate to a peripheral edge of the light-emitting element, wherein the underfill that is disposed between the second surface of the light-emitting element and the upper surface of the substrate is separated from the second surface of the light-emitting element with a clearance, and the underfill that is disposed on the upper surface of the substrate at the position proximate to the peripheral edge of the light-emitting element is in contact with the lateral surface of the light-emitting element or the fillet.

2. The light-emitting device according to claim 1, wherein a distance of the clearance from an upper surface of the underfill to the second surface of the light-emitting element is less than a distance from the upper surface of the underfill to the upper surface of the substrate.

3. The light-emitting device according to claim 1, wherein the underfill that is disposed on the upper surface of the substrate at the position proximate to the peripheral edge of the light-emitting element is in contact with the fillet or the lateral surface of the light-emitting element from the upper surface of the substrate up to a height that is a half or less of a thickness of the light-emitting element and 1/10 or more of the thickness of the light-emitting element.

4. The light-emitting device according to claim 1, wherein a lower surface of the light-transmissive member is sized in such a manner that a lateral surface of the light-transmissive member is located outside the lateral surface of the light-emitting element in plan view, the adhesive resin includes the fillet in contact with the lower surface of the light-transmissive member and the lateral surface of the light-emitting element in a continuous state from the adhesive layer, and the fillet has a right angle formed by the lower surface of the light-transmissive member and the lateral surface of the light-emitting element.

5. The light-emitting device according to claim 1, further comprising a light-reflective member covering the upper surface of the substrate, an upper surface of the underfill that is disposed on the upper surface of the substrate at the position proximate to the peripheral edge of the light-emitting element, a lateral surface of the fillet, and a lateral surface of the light-transmissive member, wherein the light-reflective member exposes an upper surface of the light-transmissive member and is a member having a higher reflectivity than the underfill.

6. The light-emitting device according to claim 1, wherein the underfill and the adhesive resin are made of an identical material.

7. The light-emitting device according to claim 1, wherein the underfill comprises a resin material, a first light-reflective material, and a diluent.

8. The light-emitting device according to claim 7, wherein, in the underfill, a weight ratio of the diluent to the resin material is in a range from 25 phr to 150 phr.

9. The light-emitting device according to claim 7, wherein the diluent is tridecane.

10. The light-emitting device according to claim 1, further comprising a lens including a curved surface protruding upward, wherein the lens is disposed on an upper surface of the light-transmissive member.

11. The light-emitting device according to claim 1, wherein an entirety of the underfill that is disposed between the second surface of the light-emitting element and the upper surface of the substrate is separated from the second surface of the light-emitting element with a clearance.

12. A method for manufacturing a light-emitting device, the method comprising:

providing a light-emitting element disposed on a substrate where an element electrode and the substrate are electrically joined through a conductive member, the substrate including wiring electrically connecting to the element electrode, the conductive member being connected to the element electrode of the light-emitting element and the wiring of the substrate, the light-emitting element including a first surface serving as a light extracting surface, a second surface serving as a bottom surface on which the element electrode is provided, and a lateral surface connecting the first surface and the second surface, disposing a light-transmissive member including a lateral surface positioned outward from the lateral surface of the light-emitting element by disposing an adhesive resin on the first surface of the light-emitting element, the adhesive resin forming a fillet on at least a part of the lateral surface of the light-emitting element; disposing an underfill on the substrate at a position proximate to a peripheral edge of the light-emitting element and on the substrate at a position facing the second surface of the light-emitting element;

drying the substrate where the underfill is disposed at a temperature of 70° C. or lower; and disposing a light-reflective member directly or indirectly covering the substrate and the light-emitting element, wherein the disposing of the light-transmissive member includes disposing the adhesive resin between the first surface of the light-emitting element and the light-transmissive member, and disposing the adhesive resin on at least a part of the lateral surface of the light-emitting element, and the underfill is disposed in a state where the underfill is in contact with the lateral surface of the light-emitting element or the adhesive resin forming the fillet disposed on the lateral surface of the light-emitting element and is disposed on the substrate in a state where the underfill is separated from the second surface of the light-emitting element with a clearance by the drying of the substrate where the underfill is disposed.

13. The method for manufacturing the light-emitting device according to claim 12, further comprising disposing a lens including a curved surface protruding upward on an upper surface of the light-transmissive member after the disposing of the light-reflective member.

14. The method for manufacturing the light-emitting device according to claim 12, wherein, in the drying of the substrate where the underfill is disposed, the underfill is formed with a distance from an upper surface of the underfill to the second surface of the light-emitting element being less than a distance from an upper surface of the substrate to the upper surface of the underfill.

15. The method for manufacturing the light-emitting device according to claim 12, wherein, in the providing of the light-emitting element disposed on the substrate, a distance between the second surface of the light-emitting element and an upper surface of the substrate is in a range from 10 μm to 110 μm.

16. The method for manufacturing the light-emitting device according to claim 12, wherein, in the providing of the light-emitting element disposed on the substrate, the conductive member is disposed on the element electrode of the light-emitting element in advance or is disposed on the substrate in advance.

17. The method for manufacturing the light-emitting device according to claim 12, wherein the adhesive resin and the underfill are made of an identical material.

18. The method for manufacturing the light-emitting device according to claim 12, wherein in the disposing of the underfill, the underfill includes a resin material, a first light-reflective material, and a diluent, and a weight ratio of the diluent to the resin material is in a range from 25 phr to 150 phr.

19. The method for manufacturing the light-emitting device according to claim 18, wherein the diluent has a boiling point in a range from 100° C. to 350° C.

20. The method for manufacturing the light-emitting device according to claim 18, wherein the diluent is tridecane.

21. The method for manufacturing the light-emitting device according to claim 12, wherein, in the drying of the substrate where the underfill is disposed, a period to raise a temperature of the substrate where the underfill is disposed is in a range from 10 minutes to 10 hours.

* * * * *